United States Patent [19]

Kobayashi

[11] Patent Number: 5,517,060

[45] Date of Patent: May 14, 1996

[54] SEMICONDUCTOR DEVICE HAVING IMPROVED BACKING CONDUCTIVE LAYERS

[75] Inventor: Makoto Kobayashi, Kanagawa, Japan

[73] Assignee: NEC Corporation, Tokyo, Japan

[21] Appl. No.: 284,121

[22] Filed: Aug. 2, 1994

[30] Foreign Application Priority Data

Aug. 3, 1993 [JP] Japan .................................. 5-191509

[51] Int. Cl.⁶ ........................ H01L 23/48; H01L 23/52; H01L 29/40
[52] U.S. Cl. ........................................ 257/758; 257/635
[58] Field of Search ................................ 257/635, 637, 257/638, 758

[56] References Cited

U.S. PATENT DOCUMENTS 5,306,947  4/1994  Adachi et al. ........................... 257/635
5,384,483  1/1995  Huang ..................................... 257/635

Primary Examiner—Sara W. Crane
Assistant Examiner—S. V. Clark
Attorney, Agent, or Firm—Popham, Haik, Schnobrich & Kaufman, Ltd.

[57] ABSTRACT

In a semiconductor device including at least two parallel conductive layers electrically isolated from each other and at least two parallel backing conductive layers opposing the two parallel conductive layers and electrically connected thereto via contact holes, a thickness of an insulating layer beneath one of the backing conductive layers is different from a thickness of an insulating layer beneath other adjacent backing conductive layers.

13 Claims, 2 Drawing Sheets

SEMICONDUCTOR DEVICE HAVING IMPROVED BACKING CONDUCTIVE LAYERS

BACKGROUND OF THE INVENTION

1. Field of the Invention

The present invention relates to a semiconductor device having a plurality of parallel conductive layers, such as word lines, and a plurality of backing conductive layers for substantially reducing the resistance of the conductive layers.

2. Description of the Related Art

In a prior art semiconductor device such as a prior art semiconductor memory device, where a plurality of parallel conductive layers, such as word lines, are provided, as the integration has advanced so that the conductive layers are fine structured, the resistance of the conductive layers becomes large. In order to reduce the resistance of the conductive layers, backing conductive layers are provided in parallel with the conductive layers, and are electrically connected to the conductive layers via contact holes at an insulating layer therebetween.

In the above-mentioned prior art semiconductor device, however, since the backing conductive layers are wider at the contact holes, it is impossible to reduce the pitch of the backing conductive layers, and as a result, it is impossible to reduce the pitch of the conductive layers. This will be explained later in detail.

SUMMARY OF THE INVENTION

It is, therefore, an object of the present invention to provide a highly-integrated semiconductor device where the pitch of parallel conductive layers parallelly connected to backing conductive layers is reduced.

According to the present invention, in a semiconductor device including at least two parallel conductive layers electrically isolated from each other and at least two parallel backing conductive layers opposing the two parallel conductive layers and electrically connected thereto via contact holes, a thickness of an insulating layer beneath one of the backing conductive layers is different from a thickness of an insulating layer beneath other adjacent backing conductive layers. Since the height of the first backing conductive layer is different from that of the second backing conductive layer, it is possible to reduce the pitch of the backing conductive layers, and accordingly, it is possible to reduce the pitch of the conductive layers.

BRIEF DESCRIPTION OF THE DRAWINGS

The present invention will be more clearly understood from the description as set forth below, in comparison with the prior art, with reference to the accompanying drawings, wherein.

DESCRIPTION OF THE PREFERRED EMBODIMENT

Before the description of the preferred embodiment, a prior art semiconductor device will be explained with reference to FIGS. 1 and 2.

Figure 1:
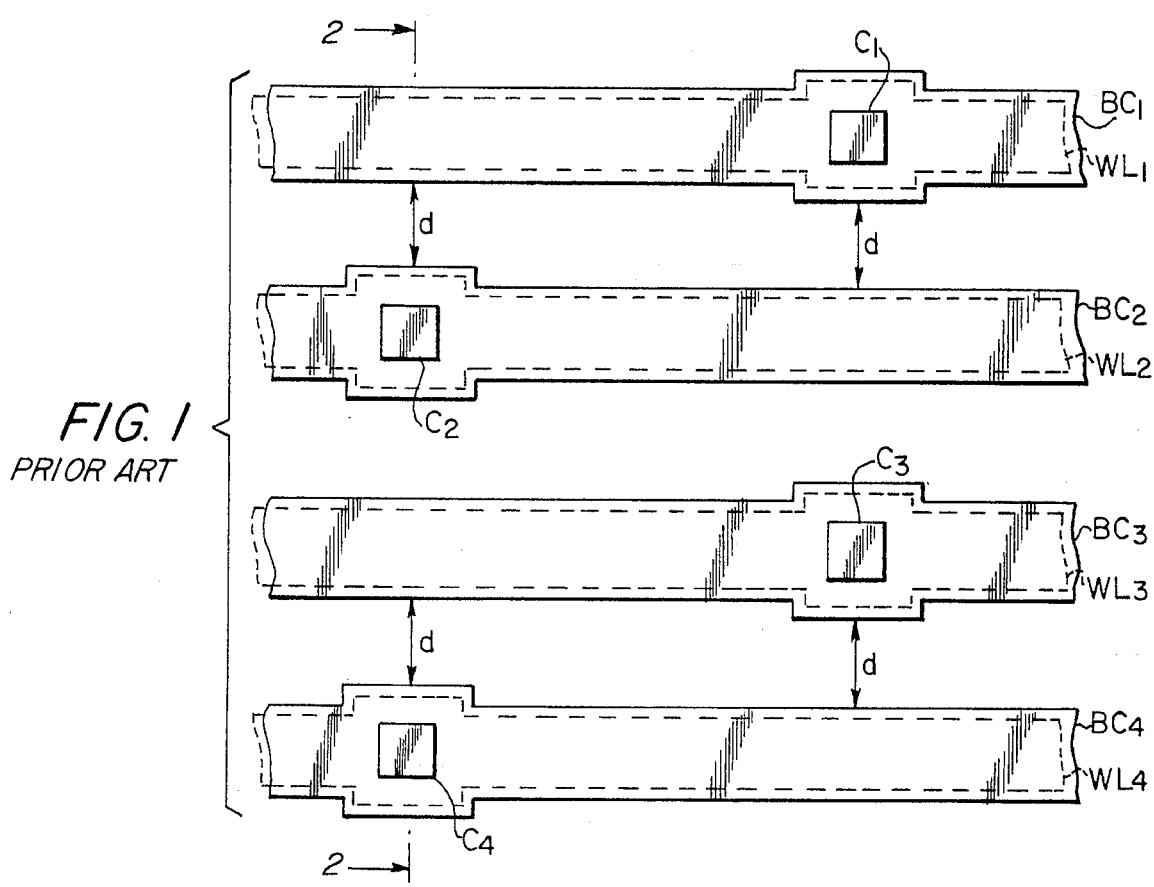
FIG. 1 is a plan view illustrating a prior art semiconductor device.
Figure 2:
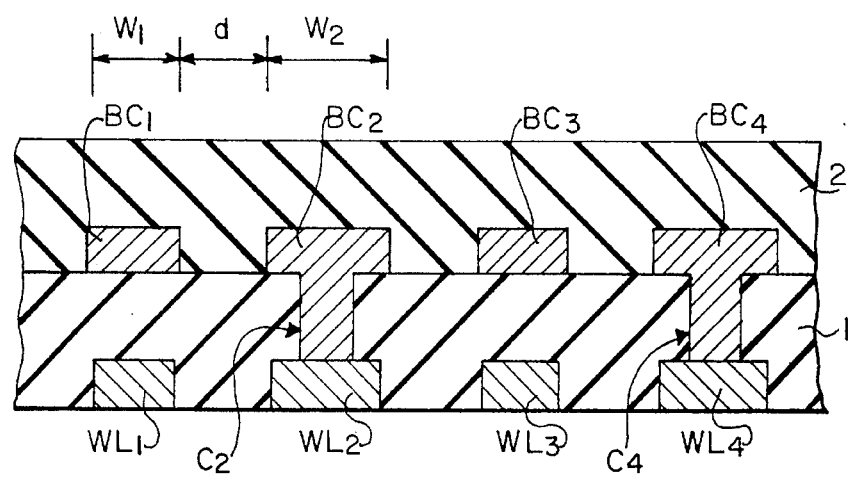
FIG. 2 is a cross-sectional view taken along the line A—A of FIG. 1.

In FIG. 1 which illustrates a prior art semiconductor device and in FIG. 2 which is a cross-sectional view taken along the line A—A of FIG. 1, conductive layers $WL_1$, $WL_2$, $WL_3$ and $WL_4$ which, in this case, serve as word lines, are formed on an insulating layer and a semiconductor substrate (not shown). The conductive layers $WL_1$, $WL_2$, $WL_3$ and $WL_4$ are made of polycrystalline silicon, for example. Formed on the conductive layers $WL_1$, $WL_2$, $WL_3$ and $WL_4$ is an insulating layer 1 made of silicon oxide, for example. Then, contact holes $C_1$, $C_2$, $C_3$ and $C_4$ are formed in the insulating layer 1. Also, backing conductive layers $BC_1$, $BC_2$, $BC_3$ and $BC_4$ made of aluminium, for example, are formed on the insulating layers 1, and the backing conductive layers $BC_1$, $BC_2$, $BC_3$ and $BC_4$ are electrically connected to the conductive layers $WL_1$, $WL_2$, $WL_3$ and $WL_4$, respectively, via the contact holes $C_1$, $C_2$, $C_3$ and $C_4$. Further, formed on the backing conductive layers $BC_1$, $BC_2$, $BC_3$ and $BC_4$ is a cap layer 2 made of silicon oxide.

Thus, the backing conductive layers $BC_1$, $BC_2$, $BC_3$ and $BC_4$ are provided in parallel with the conductive layers $WL_1$, $WL_2$, $WL_3$ and $WL_4$, respectively, and the backing conductive layers $BC_1$, $BC_2$, $BC_3$ and $BC_4$ are electrically connected to the conductive layers $WL_1$, $WL_2$, $WL_3$ and $WL_4$ via the contact holes $C_1$, $C_2$, $C_3$ and $C_4$ which are provided at regular intervals. Therefore, the resistance of the conductive layers is substantially reduced.

In the semiconductor device of FIGS. 1 and 2, however, since the spacing and width of the backing conductive layers $BC_1$, $BC_2$, $BC_3$ and $BC_4$ are both larger than those of the conductive layers $WL_1$, $WL_2$, $WL_3$ and $WL_4$, the spacing and width of the conductive layers $WL_1$, $WL_2$, $WL_3$ and $WL_4$ are determined by those of the backing conductive layers $BC_1$, $BC_2$, $BC_3$ and $BC_4$. That is, the pitch of the conductive layers $WL_1$, $WL_2$, $WL_3$ and $WL_4$ is determined by $$(W_1+W_2)/2+d$$

where $W_1$ is a minimum width of the backing conductive layers $BC_1$, $BC_2$, $BC_3$ and $BC_4$;

$W_2$ is a width of the backing conductive layers $BC_1$, $BC_2$, $BC_3$ and $BC_4$ at the contact holes $C_1$, $C_2$, $C_3$ and $C_4$; and d is a minimum spacing between the backing conductive layers $BC_1$, $BC_2$, $BC_3$ and $BC_4$. Particularly, the width $W_1$ of the backing conductive layer $BC_1$, $BC_2$, $BC_3$ and $BC_4$ at the contact holes $C_1$, $C_2$, $C_3$ and $C_4$ are very large. Therefore, it is impossible to reduce the pitch of the conductive layers $WL_1$, $WL_2$, $WL_3$ and $WL_4$.

Figure 3:
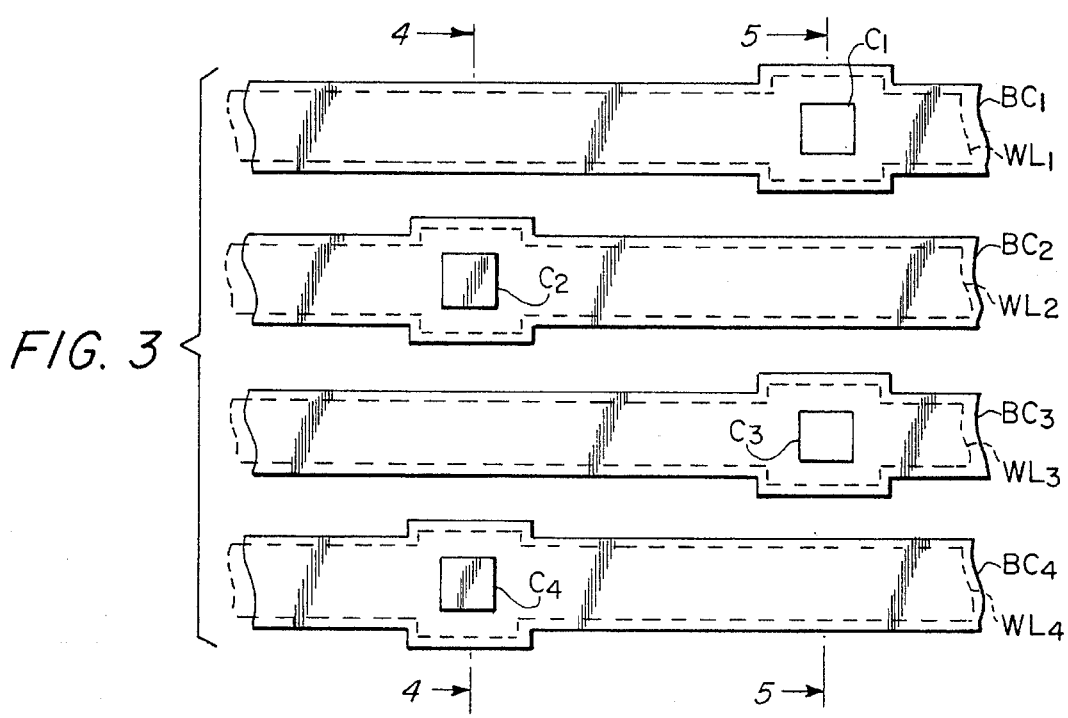
FIG. 3 is a plan view illustrating an embodiment of the semiconductor device according to the present invention.
Figure 4:
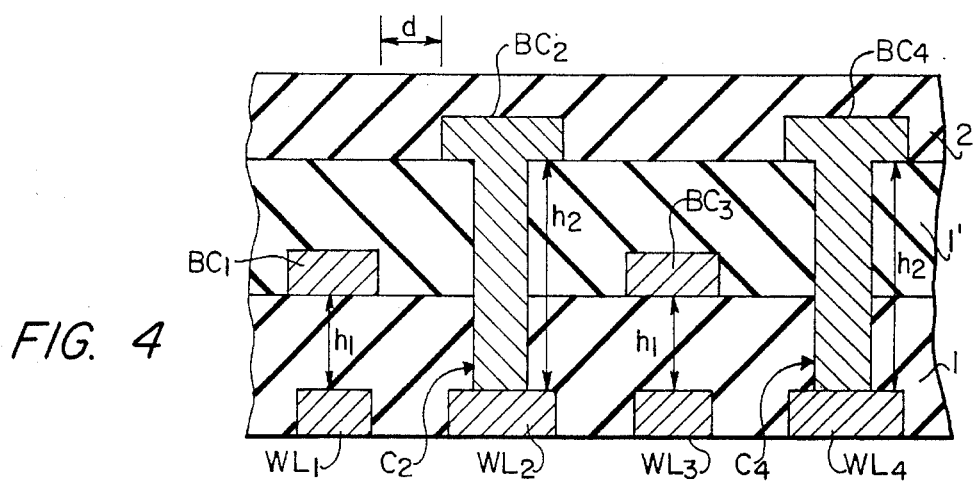
FIG. 4 is a cross-sectional view taken along the line B—B of FIG. 3.
Figure 5:
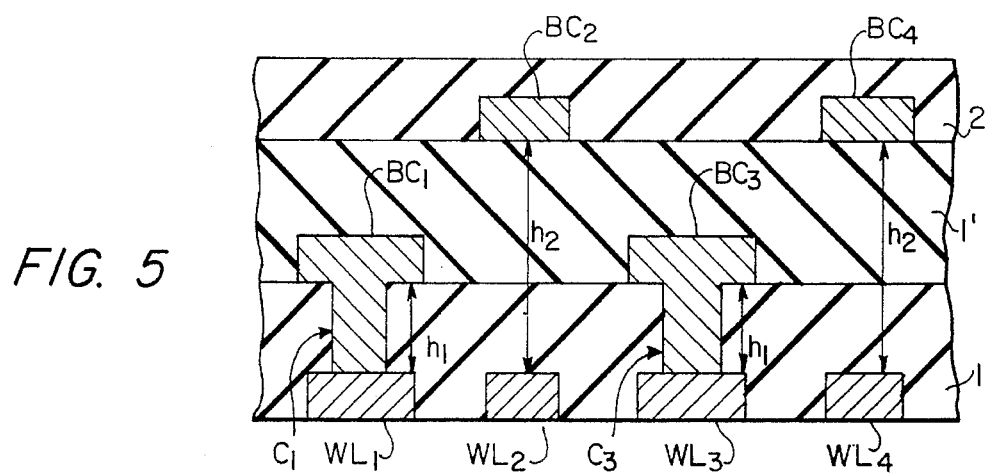
FIG. 5 is a cross-sectional view taken along the line C—C of FIG. 3.

In FIG. 3, which illustrates an embodiment of the present invention and in FIGS. 4 and 5 which are cross-sectional views taken along the line B—B and the line C—C, respectively, of FIG. 3, an insulating layer 1' made of silicon oxide, for example, is added to the elements of FIGS. 1 and 2. That is, the backing conductive layers $BC_1$ and $BC_3$ are formed on the insulating layer 1, as shown in FIG. 4 while the backing conductive layers $BC_2$ and $BC_4$ are formed on the insulating layer 1' as shown in FIG. 5. Thus, backing conductive layers $BC_1$ and $BC_3$ are separated from conductive layers $WL_1$ and $WL_3$ by a portion of insulating layer 1 having a height $h_1$, as shown in FIG. 4, and backing conductive layers $BC_2$ and $BC_4$ are separated from conductive layers $WL_2$ and $WL_4$ by a portion of insulating layers 1 and 1' having a height $h_2$, as shown in FIG. 5. As illustrated in FIGS. 4 and 5, height $h_1$ is less than height $h_2$.

Since the height of one of the backing conductive layers, such as $BC_1$, is different from that of its adjacent conductive layer, such as $BC_2$, even if the spacing d therebetween is 0, a short-circuit may not be generated. That is, the spacing and width of the backing conductive layers $BC_1$, $BC_2$, $BC_3$ and $BC_4$ never affect those of the conductive layers $WL_1$, $WL_2$, $WL_3$ and $WL_4$. Therefore, the pitch of the conductive layers $WL_1$, $WL_2$, $WL_3$ and $WL_4$ can be determined by the spacing and width thereof, per se, without consideration of the spacing and width of the backing conductive layers $BC_1$, $BC_2$, $BC_3$ and $BC_4$.

A semiconductor device according to the invention may comprise a number of conductive layers and a number of backing conductive layers according to the following formula:

(1) 2N (N−1, 2, . . .) conductive layers;

(2) N parallel first backing conductive layers, each opposing a 2i (i=1, 2, . . . , N/2)-th conductive layer and being electrically connected to the 2i-th conductive layer through contact holes; and (3) N parallel second backing conductive layers, each opposing a (2i−1) (i=1, 2, . . . , N/2)-th conductive layer and being electrically connected to the (2i−1)-th conductive layer through contact holes.

In the above-described embodiment, although the two distinct insulating layers 1 and 1' are provided, it is possible to provide only one insulating layer and perform an etching operation thereupon so as to create two portions having different thicknesses.

As explained hereinbefore, according to the present invention, since the pitch of parallel conductive layers connected to backing conductive layers is determined without consideration of the pitch of the backing conductive layers, a semiconductor device including such parallel conductive layers can be highly integrated.

I claim:

1. A semiconductor device comprising:

at least parallel first and second conductive layers electrically isolated from each other;

an insulating layer formed on said first and second conductive layers; and at least parallel first and second backing conductive layers formed on said insulating layer, said first and second backing conductive layers opposing said first and second conductive layers, respectively, said first backing conductive layer being electrically connected to said first conductive layer via a first contact hole formed in said insulating layer, and said second backing conductive layer being electrically connected to said second conductive layer via a second contact hole formed in said insulating layer, wherein a first portion of said insulating layer sandwiched between said first backing conductive layer and said first conductive layer is thinner than a second portion of said insulating layer sandwiched between said second backing conductive layer and said second conductive layer.

2. A device as set forth in claim 1, wherein said insulating layer comprises:

a first insulating layer formed on said first and second conductive layers and beneath said first backing conductive layer; and a second insulating layer formed on said first insulating layer and said first backing conductive layer and beneath said second backing conductive layer.

3. A device as set forth in claim 1, comprising a semiconductor memory device, said first and second conductive layers serving as word lines.

4. A semiconductor device comprising:

at least parallel first and second conductive layers electrically isolated from each other;

a first insulating layer formed on said first and second conductive layers;

a first backing conductive layer formed on said first insulating layer, said first backing conductive layer opposing said first conductive layer and being electrically connected to said first conductive layer via a first contact hole formed in said first insulating layer;

a second insulating layer formed on said first insulating layer and said first backing conductive layer; and a second backing conductive layer formed on said second insulating layer, said second backing conductive layer opposing said second conductive layer and being electrically connected to said second conductive layer via a second contact hole formed in said first and second insulating layers.

5. A device as set forth in claim 4, comprising a semiconductor memory device, said first and second conductive layers serving as word lines.

6. A semiconductor device comprising:

2N (N=1, 2, . . . ) conductive layers electrically isolated from each other;

an insulating layer formed on said conductive layers;

N parallel first backing conductive layers formed on said insulating layer, each of said first backing conductive layers opposing a 2i (i=1, 2, . . . , N/2)-th conductive layer of said conductive layers and being electrically connected to the 2i-th conductive layer via a contact hole formed in said insulating layer; and N parallel second backing conductive layers formed on said insulating layer, each of said second backing conductive layers opposing a (2i−1) (i=1, 2, . . . , N/2)-th conductive layer of said conductive layers and being electrically connected to the (2i−1)-th conductive layer via a contact hole formed in said insulating layer, wherein a first portion of said insulating layer sandwiched between said first backing conductive layers and said first conductive layer has a first thickness and a second portion of said insulating layer sandwiched between said second backing conductive layers and said second conductive layer has a second thickness different from said first thickness.

7. A device as set forth in claim 6, wherein said first thickness of said first portion is thinner than said second thickness of said second portion, said insulating layer comprising:

a first insulating layer formed on said conductive layers and beneath said first backing conductive layers; and a second insulating layer formed on said first insulating layer and said first backing conductive layers and beneath said second backing conductive layers.

8. A device as set forth in claim 6, wherein said second thickness of said second portion is thinner than said first thickness of said first portion, said insulating layer comprising:
- a first insulating layer formed on said conductive layers and beneath said second backing conductive layers; and
- a second insulating layer formed on said first insulating layer and said second backing conductive layers and beneath said first backing conductive layers.

9. A device as set forth in claim 6, comprising a semiconductor memory device, said first and second conductive layers serving as word lines.

10. A semiconductor device comprising:
- 2N (N=1, 2, ... ) conductive layers electrically isolated from each other;
- a first insulating layer formed on said conductive layers;
- N parallel first backing conductive layers formed on said first insulating layer, each of said first backing conductive layers opposing a 2i (i=1, 2, .., N/2)-th conductive layer of said conductive layers and being electrically connected to the 2i-th conductive layer via a contact hole formed in said first insulating layer;
- a second insulating layer formed on said first insulating layer and said first backing conductive layers; and
- N parallel second backing conductive layers formed on said second insulating layer, each of said second backing conductive layers opposing a 2i−1 (i=1, 2, ... , N/2)-th conductive layer of said conductive layers and being electrically connected to the (2i−1)-th conductive layer via a contact hole formed in said first and second insulating layers.

11. A device as set fourth in claim 10, comprising a semiconductor memory device, said first and second conductive layers serving as word lines.

12. A semiconductor device comprising:
- 2N (N=1, 2, ... ) conductive layers electrically isolated from each other;
- a first insulating layer formed on said conductive layers;
- N parallel first backing conductive layers formed on said first insulating layer, each of said first backing conductive layers opposing a 2i−1 (i=1, 2, ... , N/2)-th conductive layer of said conductive layers and being electrically connected to the (2i−1)-th conductive layer via a contact hole formed in said first insulating layer;
- a second insulating layer formed on said first insulating layer and said first backing conductive layers; and
- N parallel second backing conductive layers formed on said second insulating layer, each of said second backing conductive layers opposing a 2i (i=1, 2, .., N/2)-th conductive layer of said conductive layers and being electrically connected to the 2i-th conductive layer via a contact hole formed in said first and second insulating layers.

13. A device as set forth in claim 12, comprising a semiconductor memory device, said first and second conductive layers serving as word lines.

* * * * *